(12) United States Patent
Jiang et al.

(10) Patent No.: US 11,428,730 B2
(45) Date of Patent: Aug. 30, 2022

(54) SENSOR CIRCUIT DIAGNOSIS

(71) Applicant: Baker Hughes Oilfield Operations LLC, Houston, TX (US)

(72) Inventors: Jianjun Jiang, Shanghai (CN); Guijun Zhang, Shanghai (CN); Peipei Wang, Shanghai (CN); Daniel Zahi Abawi, Gardnerville, NV (US)

(73) Assignee: BAKER HUGHES OILFIELD OPERATIONS LLC, Houston, TX (US)

(*) Notice: Subject to any disclaimer, the term of this patent is extended or adjusted under 35 U.S.C. 154(b) by 61 days.

(21) Appl. No.: 16/919,402

(22) Filed: Jul. 2, 2020

(65) Prior Publication Data
US 2022/0003809 A1 Jan. 6, 2022

(51) Int. Cl.
*G01R 31/28* (2006.01)
*G01D 5/22* (2006.01)
*H02J 50/10* (2016.01)
*G01D 18/00* (2006.01)

(52) U.S. Cl.
CPC ....... *G01R 31/2829* (2013.01); *G01D 5/2291* (2013.01); *G01D 18/00* (2013.01); *H02J 50/10* (2016.02)

(58) Field of Classification Search
CPC .. G01R 31/2829; G01D 5/2291; G01D 18/00; H02J 50/00
See application file for complete search history.

(56) References Cited

U.S. PATENT DOCUMENTS

| | | | |
|---|---|---|---|
| 2015/0023062 A1* | 1/2015 | Hyugaji | H02M 3/33592 363/16 |
| 2015/0207336 A1* | 7/2015 | Morreale | H02J 50/80 307/104 |
| 2016/0226386 A1* | 8/2016 | Fukuta | B60L 50/60 |
| 2017/0250547 A1* | 8/2017 | Menze | H02J 7/0024 |
| 2018/0301999 A1* | 10/2018 | Moon | H02M 3/33592 |

* cited by examiner

*Primary Examiner* — Jermele M Hollington
*Assistant Examiner* — Temilade S Rhodes-Vivour
(74) *Attorney, Agent, or Firm* — Mintz Levin Cohn Ferris Glovsky and Popeo, PC; Lisa Adams

(57) ABSTRACT

A method includes receiving data characterizing an output of a sensor coupled to an industrial equipment. The output can include a sum of a first secondary coil and a voltage of a second secondary coil. The first secondary coil can be included in a first circuit and the second secondary coil can be included in second circuit configured within the sensor. The method can also include determining an integrity state of a circuit configured within the sensor. The integrity state can be determined based on the received data. The integrity state can identify a state of operation of the circuit configured within the sensor. The method can further include providing the integrity state. Related systems, techniques, and non-transitory computer readable mediums are also described.

15 Claims, 3 Drawing Sheets

SENSOR CIRCUIT DIAGNOSIS

BACKGROUND

Sensors can be coupled to industrial equipment to monitor an operating characteristic of the industrial equipment. Sensors can include electrical circuits configured to convey signal data associated with the operating characteristic being sensed by the sensor. Circuits and/or sensor components can experience failures which can, cause the sensor to generate inaccurate signal data. Diagnosing sensor circuit operation in an accurate manner can be an important safety requirement to ensure that the sensors and the industrial equipment are operating properly.

SUMMARY

In an aspect, a method includes receiving data characterizing an output of a sensor coupled to an industrial equipment. The output can include a sum of a voltage of a first secondary coil and a voltage of a second secondary coil. The first secondary coil can be included in a first circuit and the second secondary coil can be included within second circuit configured within the sensor. The method can also include determining, based on the received data, an integrity state of at least one circuit configured within the sensor. The integrity state can identify a state of operation of the at least one circuit configured within the sensor. The method can further include providing the integrity state.

One or more of the following features can be included in any feasible combination. For example, the method can also include generating an alarm based on the integrity state. The method can further include displaying the alarm within a graphical user interface to an operator of the industrial equipment and/or causing a modification in operation of the industrial equipment. The received data can include analog data and/or digital data. The sensor can include a linear variable differential transformer sensor. The integrity state of the at least one circuit configured within the sensor can include one of a functional state, an open circuit state, a short circuit state, and a short one or more turns state.

The linear variable differential transformer can include a primary coil coupled to a voltage source, a first wire and a second wire connected to the primary coil, a first secondary coil spaced part from the primary coil, and a third wire connected to a first end of the first secondary coil. The third wire can be included in the first circuit. The linear variable differential transformer can also include a second secondary coil spaced apart from the primary coil and the first secondary coil, and a fourth wire connected to a first end of the second secondary coil. The fourth wire can be included in the second circuit. The linear variable differential transformer can further include a fifth wire connected to a second end of the first secondary coil and a second end of the second secondary coil, and a ferromagnetic core adjacent to the primary coil, the second coil, and the third coil.

The voltage source can provide an alternating voltage to the primary coil, via the first wire and the second wire, and can cause the primary coil to generate an electromagnetic field inducing a voltage within the first secondary coil and a voltage within the second secondary coil.

The method of determining an integrity state of at least one circuit configured within the sensor can further include determining that the sum of the voltage of the first secondary coil and the voltage of the second secondary coil is zero, and determining, based on the sum of the voltage of the first secondary coil and the voltage of the second secondary coil being zero, that the integrity state can include the open circuit state for a third circuit including the fifth wire connected to the second end of the first secondary coil and the second end of the second secondary coil. The method of determining an integrity state of at least one circuit configured within the sensor can also include determining a change in the sum of the voltage of the first secondary coil and the voltage of the second secondary coil compared to a fixed voltage value, and determining, based on the change in the sum of the voltage of the first secondary coil and the voltage of the second secondary coil compared to the fixed voltage value, that the integrity state can include the short circuit state for a fourth circuit including one of the primary coil, the first secondary coil, and the second secondary coil. The change in the sum of the voltage of the first secondary coil and the voltage of the second secondary coil can result from a short one or more turns of the primary coil, or the first secondary coil, or the second secondary coil. The method of determining an integrity state of at least one circuit configured within the sensor can further include determining a change in the sum of the voltage of the first secondary coil and the voltage of the second secondary coil compared to a fixed voltage value, and determining, based on the change in the sum of the voltage of the first secondary coil and the voltage of the second secondary coil compared to the fixed voltage value, that the integrity state can include the short circuit state for a fifth circuit including the first wire and the second wire connected to the primary coil, and the third wire connected to a first end of the first secondary coil, and the fourth wire connected to the first end of the second secondary coil. The change in the sum of the voltage of the first secondary coil and the voltage of the second secondary coil can results from a short at one or more locations of the fifth circuit.

The industrial equipment can include one of a valve, and/or components of a valve, a turbine, and/or components of a turbine, a roller machine, and/or components of a roller machine, a compressor, and/or components of a compressor, a rudder in airplane and/or components of a rudder in an airplane, a rudder in a ship and/or components of a rudder in a ship, and/or components of artillery equipment, and/or components of artillery equipment.

Non-transitory computer program products (i.e., physically embodied computer program products) are also described that store instructions, which when executed by one or more data processors of one or more computing systems, causes at least one data processor to perform operations herein. Similarly, computer systems are also described that may include one or more data processors and memory coupled to the one or more data processors. The memory may temporarily or permanently store instructions that cause at least one processor to perform one or more of the operations described herein. In addition, methods can be implemented by one or more data processors either within a single computing system or distributed among two or more computing systems. Such computing systems can be connected and can exchange data and/or commands or other instructions or the like via one or more connections, including a connection over a network (e.g. the Internet, a wireless wide area network, a local area network, a wide area network, a wired network, or the like), via a direct connection between one or more of the multiple computing systems, etc.

For example, a system can include at least one data processor and a memory storing instructions, which when executed by the at least one data processor causes the at least one data processor to perform the method. The sensor can include a linear variable differential transformer sensor. The linear variable differential transformer sensor can include a primary coil coupled to a voltage source, a first wire and a second wire connected to the primary coil, a first secondary coil spaced part from the primary coil, and a third wire connected to a first end of the first secondary coil. The third wire can be included in the first circuit. The linear variable differential transformer can also include a second secondary coil spaced apart from the primary coil and the first secondary coil, and a fourth wire connected to a first end of the second secondary coil. The fourth wire can be included in the second circuit. The linear variable differential transformer can further include a fifth wire connected to a second end of the first secondary coil and a second end of the second secondary coil, and a ferromagnetic core adjacent to the primary coil, the first secondary coil, and the second secondary coil.

The instructions can further cause the processor to determine that the integrity state of the primary coil is the open circuit state and/or the short circuit state based on the sum of the voltage of the first secondary coil and the voltage of the second secondary coil equaling zero.

The instructions can further cause the processor to determine that the integrity state of the first wire and/or the second wire connected to the primary coil is the open circuit state and/or the short circuit state based on the sum of the voltage of the first secondary coil and the voltage of the second secondary coil equaling zero.

The instructions can further cause the processor to determine that the integrity state of the first secondary coil is the open circuit state and/or the short circuit state based on the sum of the voltage of the first secondary coil and the voltage of the second secondary coil equaling a voltage of the fourth wire connected to a first end of the second secondary coil, the fourth wire included in the second circuit.

The instructions can further cause the processor to determine that the integrity state of the second secondary coil of the sensor is the open circuit state and/or the short circuit state based on the sum of the voltage of the first secondary coil and the voltage of the second secondary coil equaling a voltage of the third wire connected to a first end of the first secondary coil, the third wire included in the first circuit.

The instructions can further cause the processor to determine that the integrity state of the third wire connected to a first end of the first secondary coil, the third wire included in the first circuit is the open circuit state and/or the short circuit state based on the sum of the voltage of the first secondary coil and the voltage of the second secondary coil equaling a voltage of the fourth wire connected to a first end of the second secondary coil, the fourth wire included in the second circuit.

The instructions can further cause the processor to determine that the integrity state of the fourth wire connected to a first end of the second secondary coil, the fourth wire included in the second circuit is the open circuit state and/or the short circuit state based on the sum of the voltage of the first secondary coil and the voltage of the second secondary coil equaling a voltage of the third wire connected to a first end of the first secondary coil, the third wire included in the first circuit.

The instructions can further cause the processor to determine that the integrity state of the third wire connected to a first end of the first secondary coil, the third wire included in the first circuit and the fourth wire connected to a first end of the second secondary coil, the fourth wire included in the second circuit is the short circuit state based on the sum of the voltage of the first secondary coil and the voltage of the second secondary coil equaling zero.

The instructions can further cause the processor to determine that the circuit integrity state of the fifth wire connected to the second end of the first secondary coil and the second end of the second secondary coil is the open circuit state based on the sum of the voltage of the first secondary coil and the voltage of the second secondary coil equaling zero.

The instructions can further cause the processor to determine that the integrity state of the primary coil, or the first secondary coil, or the second secondary coil is the short one or more turns state based on a change in the sum of the voltage of the first secondary coil and the voltage of the second secondary coil.

The instructions can further cause the processor to determine that the integrity state of the first wire and the second wire connected to the primary coil, and the third wire connected to the first end of the first secondary coil, or the fourth wire connected to the first end of the second secondary coil is the short circuit state based on a change in the sum of the voltage of the first secondary coil and the voltage of the second secondary coil.

DESCRIPTION OF DRAWINGS

These and other features will be more readily understood from the following detailed description taken in conjunction with the accompanying drawings, in which.

It is noted that the drawings are not necessarily to scale. The drawings are intended to depict only typical aspects of the subject matter disclosed herein, and therefore should not be considered as limiting the scope of the disclosure.

DETAILED DESCRIPTION

Sensor circuit diagnostic systems traditionally monitor only a partial number of circuits within a sensor and may not be configured to monitor a full range of circuits that may be configured within a sensor. For example, traditional sensor circuit diagnostic systems may be configured to determine an operational state of sensor circuits by evaluating secondary coil voltages in a linear variable differential transformer (LVDT). Based on determining the sum of the voltage of the first secondary coil and the voltage of the second secondary coil is above a threshold value, such as 0.6V, it may be determined that the LVDT sensor circuits are operating normally. However, this approach may not be sufficient to determine the functional state of LVDT sensor circuits if a partial short circuit or an open circuit exist in the LVDT sensor. In these situations, the voltage transformation ratio (VTR) of the secondary sensor circuits is changed and traditional sensor circuit diagnostic systems cannot adequately determine a functional state of a broad range of the circuits configured within a LVDT sensor. This can lead to inaccurate diagnosis of sensor operation, misinterpretation of the operational state of equipment the sensor can be coupled to, and/or hazardous or unsafe operating conditions of the equipment being monitored by the sensor.

An example approach to determining a functional state of one or more LVDT circuits is described herein. The approach can enable an improved sensor circuit diagnosis system, also described herein, to confirm if a sum voltage of two secondary coils is a stable, fixed voltage when the exciting voltage provided via the primary coil is fixed. Using this approach, if there is any change in the sensor circuits including the primary and/or secondary coils as well as the primary and/or secondary wiring, the sum voltage will be changed. The example approach described herein can include monitoring the sum voltage to determine a functional state, also referred to as an integrity state, for detection of open and/or short circuits for LVDT circuits including one or more coils and/or one or more wires.

Figure 1:
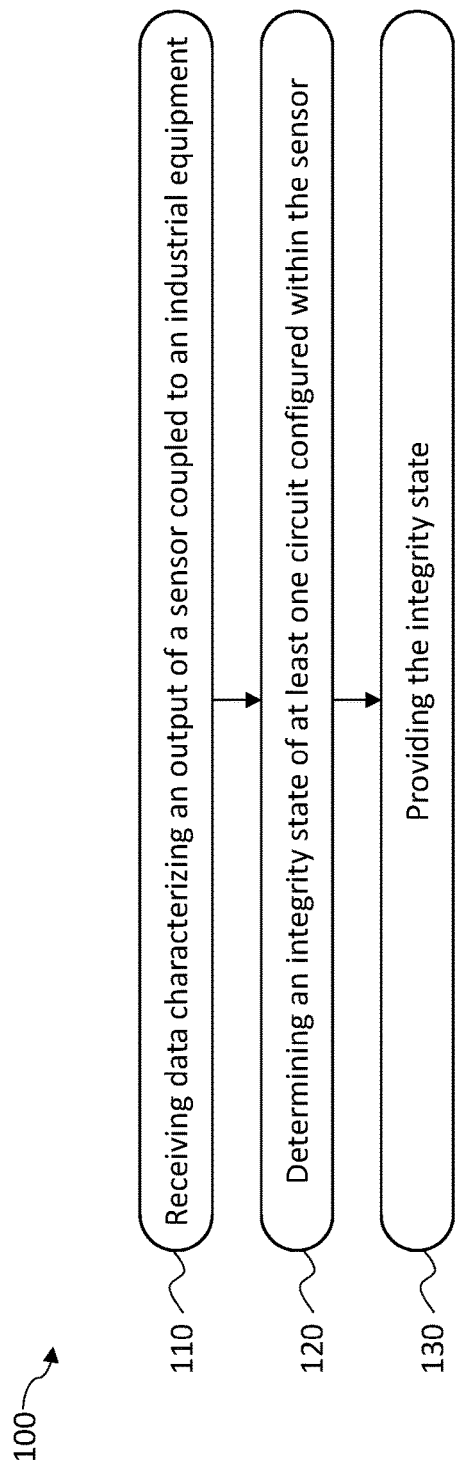
FIG. 1 illustrates an example process for determining an integrity state of a circuit configured within a sensor.

FIG. 1 is a process flow diagram illustrating an example process 100 for determining an integrity state of a circuit configured within a sensor. The method 100 can be performed by one or more components of a sensor circuit diagnosis system coupled to the sensor and to industrial equipment that being monitored by the sensor. The process can determine an integrity state of one or more circuits configured within the sensor such as a functional circuit state, an open circuit state, a short circuit state, or a short one or more turns state. The short one or more turns state can indicate that a short exists in one or more turns of the primary coil, the first secondary coil, or the second secondary coil. By determining an integrity state of the circuit, the operational behavior of the circuit can be identified so that operators of the sensor and/or equipment monitored using the sensor can ensure the sensor is operating as intended.

At 110, data characterizing an output of a sensor coupled to an industrial equipment can be received by a sensor circuit diagnosis system. The received data can include analog data, and/or digital data. In some embodiments, the sensor can include a linear variable differential transformer (LVDT) sensor. The sensor can be coupled to industrial equipment including a valve, components of a valve, a turbine, components of a turbine, a roller, and/or components of a roller machine, a compressor, and/or components of a compressor, rudder in airplane, aircraft carrier and ships, and/or components of rudder, an artillery, and/or components of artillery, and/or the like. In some embodiments, the industrial equipment can include a physical system or a component of a physical system associated with an power generation production environment. For example, the physical system can include a steam turbine, valve, a motor, a pump, or any similar electro-mechanical equipment of the power generation production environment.

The output of the sensor can include a voltage sum of two secondary coils or two secondary circuits configured within the sensor. Based on the operating principle of an alternating current LVDT sensor, the sum of the voltages of the secondary coils and/or circuits is dependent upon the voltage provided through a primary coil and the LVDT voltage transformation ratio. Thus, for a constant primary coil voltage, the voltage sum of the two secondary coils will be constant only when the both the operation of the sensor coils and wiring are operationally functional and do not include a short circuit or an open circuit.

At 120, an integrity state of at least one circuit configured within the sensor can be determined. The integrity state can be determined based on the received data. The integrity state can identify a state of operation of at least one circuit configured within the sensor. For example, the integrity state can identify if a circuit or a component of the sensor, such as a wire, or a coil, is functioning properly. In some embodiments, the integrity state can identify that a circuit or a component of the sensor, such as a wire or a coil, includes a short circuit or an open circuit, and is not functioning properly.

The integrity state can be determined for a variety of circuits configured within the sensor, such as circuits including a secondary center tap wire, a primary coil, a secondary coil, a primary wire, and/or a secondary wire. For example, in some embodiments, the determining can include determining that the sum of the voltage of two secondary coils is zero. Based on the sum of the voltage of the two secondary coils being zero, the integrity state can be determined to be an open circuit state for a circuit including a ground wire connected to a second end of a first secondary coil and a second secondary coil of the sensor.

In some embodiments, the determining can include determining a change in a sum of the voltage of the two secondary coils as compared to a fixed voltage. Based on determining the change in the sum of the voltage of the two secondary coils, the integrity state can be determined to be a short circuit state for a circuit including a primary coil, the first secondary coil, and the second secondary coil of the sensor. The change in the sum of the voltage of the two secondary coils can result from a short on one or more turns of the primary coil, or the first secondary coil, or the second secondary coil of the sensor.

In some embodiments, based on determining the change in the sum of the voltage of the two secondary coils, the integrity state can be determine to be a short circuit state for a circuit including a primary wire coupled to the primary coil of the sensor, and a secondary wire coupled to a secondary coil of the sensor. The change in the sum of the voltage of the two secondary coils can result from a short at one or more locations between the primary wire coupled to the primary coil, and the secondary wire coupled to the secondary coil.

In some embodiments, the determining can also include determining that the integrity state of a primary coil circuit can be the open circuit state and/or the short circuit state based on the sum of the voltage of the two secondary coils equaling zero.

In some embodiments, the determining can also include determining that the integrity state of a primary wire circuit can be the open circuit state and/or the short circuit state based on the sum of the voltage of the two secondary coils equaling zero.

In some embodiments, the determining can also include determining that the integrity state of a first secondary coil circuit can be the open circuit state and/or the short circuit state based on the sum of the voltage of the two secondary coils equaling a voltage of a secondary wire connected to a first end of the second secondary coil. The secondary wire can be included in the second circuit.

In some embodiments, the determining can also include determining that the integrity state of the a second secondary coil can be the open circuit state and/or the short circuit state based on the sum of the voltage of the two secondary coils equaling a voltage of a secondary wire connected to a first end of the first secondary coil. The secondary wire can be included in the first circuit.

In some embodiments, the determining can also include determining that the integrity state of a first secondary wire connected to the first end of the first secondary coil can be the open circuit state and/or the short circuit state based on the sum of the voltage of the two secondary coils equaling a voltage of a second secondary wire connected to a the first end of the second secondary coil. The first secondary wire can be included in the first circuit and the second secondary wire can be included in the second circuit.

In some embodiments, the determining can also include determining that the integrity state of the second secondary wire connected to the first end of the second secondary coil can be the open circuit state and/or the short circuit state based on the sum of the voltage of the two secondary coils equaling a voltage of the first secondary wire connected to the first end of the first secondary coil. The first secondary wire can be included in the first circuit and the second secondary wire can be included in the second circuit.

In some embodiments, the determining can also include determining that the integrity state of the first secondary wire connected to the first end of the first secondary coil and the second secondary wire connected to the first end of second secondary coil can be the short circuit state based on the sum of the voltage of the two secondary coils equaling zero. The first secondary wire can be included in the first circuit, and the second secondary wire can be included in the second circuit.

Figure 3:
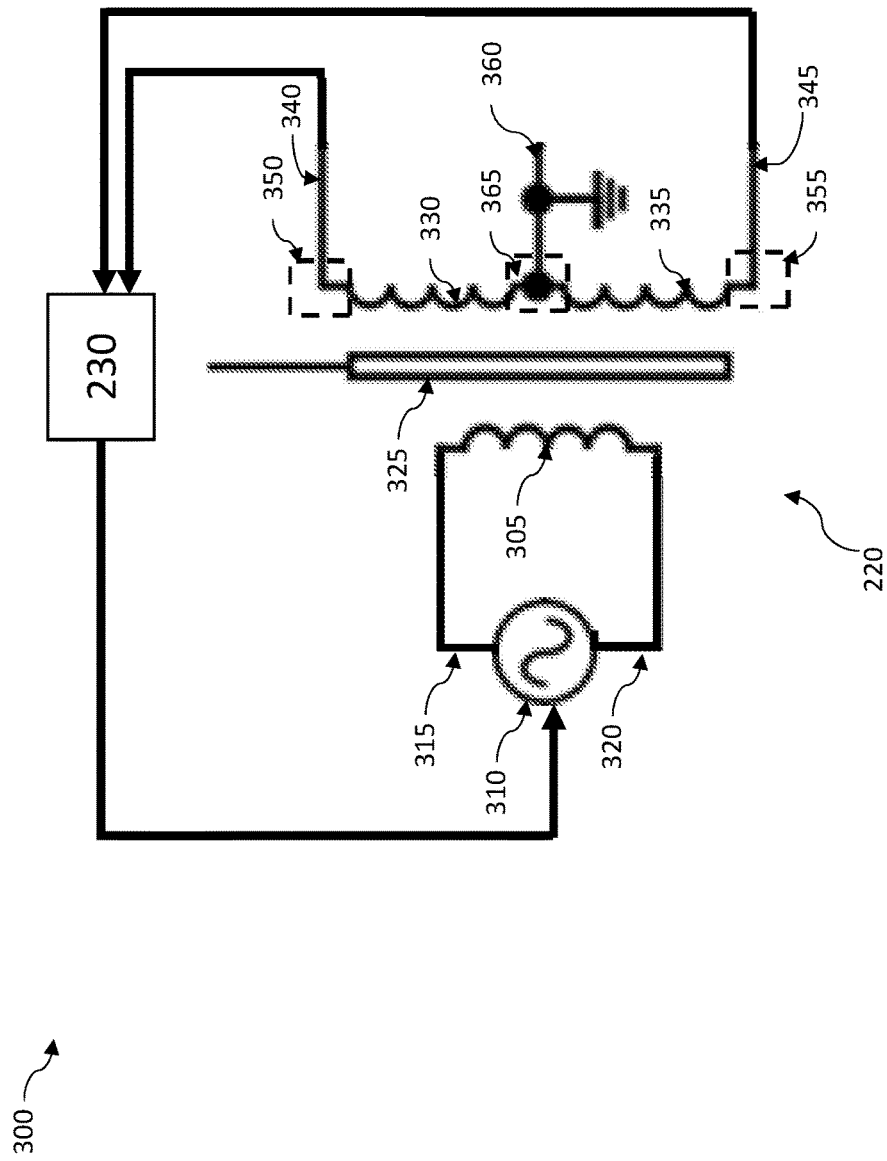
FIG. 3 illustrates a schematic diagram of an example sensor included in the example sensor circuit diagnosis system of FIG. 2 configured to perform the process of FIG. 1 according to some implementations of the current subject matter.

Further description of the various circuits configured within the sensor will be provided in relation to FIG. 3.

At 130, the integrity state can be provided. The determined integrity state can be provided to inform an operator of the sensor or the industrial equipment that the sensor is operating in a functional or non-functional state. For example, an alarm can be generated based on the integrity state. The alarm can be displayed to the operator of the sensor and/or the industrial equipment on or within a graphical user interface (GUI) that may be configured on a display of a computing device coupled to the sensor. The computing device can be configured with a memory to store the provided integrity states associated with one or more sensors. In some embodiments, a modification to the operation of the industrial equipment can be caused by the integrity state and/or the generated alarm. For example, based on an integrity state indicating a non-functional state of operation of the sensor, the computing device can be configured to turn the industrial equipment off, to change an operating parameter of the industrial equipment, and/or to change a frequency of operation of the industrial equipment and/or the sensor coupled to the industrial equipment.

Figure 2:
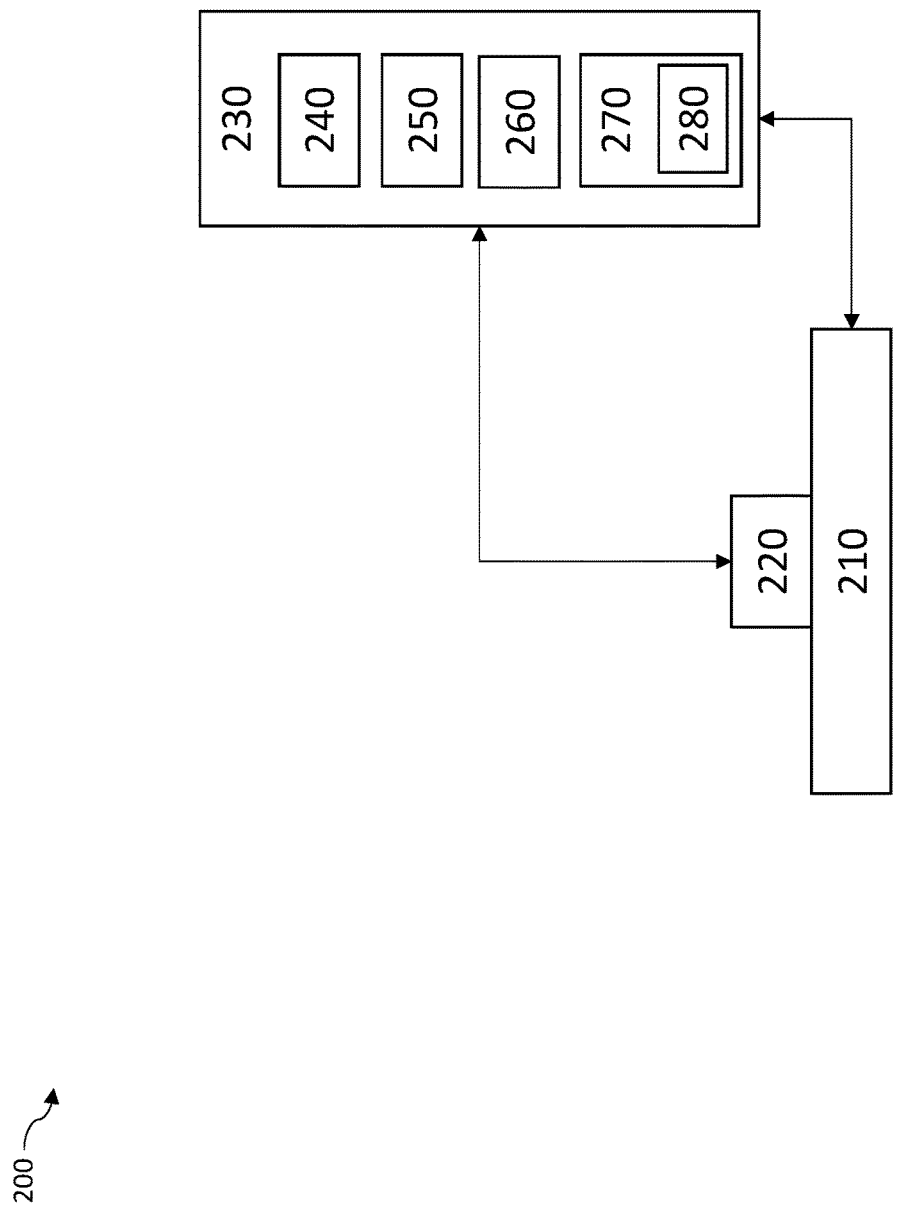
FIG. 2 illustrates a block diagram of an example sensor circuit diagnosis system according to some implementations of the current subject matter.

FIG. 2 is a block diagram 200 of an example sensor circuit diagnosis system. The sensor circuit diagnosis system includes a computing device 230 configured to perform the method 100 of FIG. 1. The computing device 230 is communicatively coupled to a sensor 220 and to an industrial equipment 210. The industrial equipment 210 can include a machine or component of a machine. In some embodiments, the industrial equipment can include a valve, a turbine, a roller, and/or components of a roller machine, a compressor, and/or components of a compressor, rudder in airplane, aircraft carrier and ships, and/or components of rudder, an artillery, and/or components of artillery. In some embodiments, the industrial equipment can include a physical system or a component of a physical system associated with an power generation production environment. For example, the physical system can include a steam turbine, a valve, a motor, a pump, or any similar electro-mechanical equipment of the power generation production environment.

As shown in FIG. 2, the sensor 220 is coupled to the industrial equipment 210. The sensor 220 can be configured to output data including a sum of the voltage of two secondary coils configured within the sensor 220. In some embodiments, the sensor can include an LVDT sensor. Additional details of an LVDT sensor 220 will be described in relation to FIG. 3. In some embodiments, the sensor 220 can be configured to generate the output in relation to a vibration, location, displacement, acceleration, a rotation, or the like of the industrial equipment 210 to which it is coupled.

The sensor 220 can output data to a computing device 230 coupled to the sensor 220. The computing device 230 can include a multiple inter-connected components, such as a processor 240, a memory 250, a controller 260, and a display 270. The display 270 can include a GUI 280. The processor 240 can be configured to execute computer-readable instructions stored the memory 250 to perform the method 100 described in relation to FIG. 1. The memory 250 can further store integrity states determined for one or more sensors 220 and one or more sensor configurations of sensors 220. The processor 240 can also execute computer-readable instructions stored in the memory 250, which cause the processor 240 to control operations of the industrial equipment 210 and/or the sensor 220 via the controller 260. In this way, the controller 260 can control an operation of the industrial equipment based on an integrity state for a circuit of the sensor 220 as determined by the processor 240.

As shown in FIG. 2, the computing device 230 includes a display 270 configured with a GUI 280. The GUI 280 can display an alarm based on the integrity state. The alarm can be displayed to an operator of the industrial equipment via the GUI 280. In some embodiments, the alarm can cause the controller 260 to modify an operator of the industrial equipment. For example, based on the processor 240 determining a short circuit integrity state for the sensor 220, the controller 260 can cause the industrial equipment 210 to cease operation or to change a mode or frequency of operation of the industrial equipment 210.

FIG. 3 is a schematic diagram of a sensor 220 coupled to a computing device 230 included in the sensor circuit diagnosis system of FIG. 2. The computing device 230 can be configured to perform the process described in relation to FIG. 1 for determining an integrity state of a sensor, such as sensor 220. The schematic diagram of the sensor 220 shown in FIG. 3 corresponds to a schematic diagram of an LVDT sensor.

As shown in FIG. 3, the sensor 220 includes a primary coil 305 coupled to an alternating voltage source 310 from a computing device 230 via a first primary wire 315 and a second primary wire 320. A primary wire circuit can include the first primary wire 315 and/or the second primary wire 320. A primary coil circuit can include the primary coil 305. The sensor 220 also includes a ferromagnetic core 325 adjacent to the primary coil 305 and adjacent to a first secondary coil 330 and a second secondary coil 335. The sensor 220 can include three solenoidal coils, each including a number of turns, (e.g., coils 305, 330, and 335) placed end-to-end around a tube (not show). The ferromagnetic core 325 can slide along the axis of the tube. An alternating voltage from the alternating voltage source 310 drives the primary coil 305 and causes a voltage to be induced in each of the secondary coils 330 and 335 that is proportional to the length of the ferromagnetic core 325 linking to the secondary. The frequency is usually in the range 400 Hz to 10 kHz.

As the ferromagnetic core 325 moves, the primary coil 305 linkage to the two secondary coils 330 and 335 changes and causes the induced voltages within the secondary coils 330 and 335 to change. The secondary coils 330 and 335 are connected such that the output voltage is the sum between the first secondary wire 340 voltage and the second secondary wire 345 voltage. When the ferromagnetic core 325 is in a central position, which is equidistant between the two secondary coils 330 and 335, equal amounts of voltage are induced in the two secondary coils 330 and 335, but the two signals cancel, so the output voltage is theoretically zero.

As shown in FIG. 3, the first secondary wire 340 can couple to the first secondary coil 330 at a first end 350 of the first secondary coil 330. A first secondary coil circuit can include the first secondary coil 330. A first secondary wire circuit can include the first secondary wire 340. The second secondary wire 345 can couple to the second secondary coil 335 at a first end 355 of the second secondary coil 335. A second secondary coil circuit can include the second secondary coil 335. A second secondary wire circuit can include the second secondary wire 345. A ground wire 360 can be coupled to the first and to the second secondary coils at 365 which can correspond to a second end of the first secondary coil 330 and a second end of the second secondary coil 335. A ground wire circuit can include the ground wire 360.

Exemplary technical effects of the methods, systems, and computer-readable medium described herein include, by way of non-limiting example, determining an integrity state of at least one circuit configured within a sensor and providing the integrity state within a sensor circuit diagnostic system. Determining the integrity state based on data including a sum of the voltage of the two secondary coils can enable circuit diagnosis for a broad range of circuit configurations within an LVDT sensor. For example, determining the integrity state as described herein can enable greater diagnostic precision when diagnosing a circuit including a ground wire or secondary center tap wire, a primary coil, one or more secondary coils, one or more primary wires, and one or more secondary wires. The sensor circuit diagnostic system configured to perform the methods described herein can provide more accurate diagnosis of sensor faults or malfunction and thus enable more robust operation of sensors and industrial equipment being monitored by the sensors. The sensor circuit diagnosis system can also include improved interfaces for providing an integrity state. Further, the sensor circuit diagnosis system can cause a change in operation of the industrial equipment based on the determined sensor circuit integrity state which can ensure industrial equipment operates within acceptable or safe operating parameters.

Certain exemplary embodiments have been described to provide an overall understanding of the principles of the structure, function, manufacture, and use of the systems, devices, and methods disclosed herein. One or more examples of these embodiments have been illustrated in the accompanying drawings. Those skilled in the art will understand that the systems, devices, and methods specifically described herein and illustrated in the accompanying drawings are non-limiting exemplary embodiments and that the scope of the present invention is defined solely by the claims. The features illustrated or described in connection with one exemplary embodiment can be combined with the features of other embodiments. Such modifications and variations are intended to be included within the scope of the present invention. Further, in the present disclosure, like-named components of the embodiments generally have similar features, and thus within a particular embodiment each feature of each like-named component is not necessarily fully elaborated upon.

The subject matter described herein can be implemented in analog electronic circuitry, digital electronic circuitry, and/or in computer software, firmware, or hardware, including the structural means disclosed in this specification and structural equivalents thereof, or in combinations of them. The subject matter described herein can be implemented as one or more computer program products, such as one or more computer programs tangibly embodied in an information carrier (e.g., in a machine-readable storage device), or embodied in a propagated signal, for execution by, or to control the operation of, data processing apparatus (e.g., a programmable processor, a computer, or multiple computers). A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processor of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, (e.g., EPROM, EEPROM, and flash memory devices); magnetic disks, (e.g., internal hard disks or removable disks); magneto-optical disks; and optical disks (e.g., CD and DVD disks). The processor and the memory can be supplemented by, or incorporated in, special purpose logic circuitry.

To provide for interaction with a user, the subject matter described herein can be implemented on a computer having a display device, e.g., a CRT (cathode ray tube) or LCD (liquid crystal display) monitor, for displaying information to the user and a keyboard and a pointing device, (e.g., a mouse or a trackball), by which the user can provide input to the computer. Other kinds of devices can be used to provide for interaction with a user as well. For example, feedback provided to the user can be any form of sensory feedback, (e.g., visual feedback, auditory feedback, or tactile feedback), and input from the user can be received in any form, including acoustic, speech, or tactile input.

The techniques described herein can be implemented using one or more modules. As used herein, the term "module" refers to computing software, firmware, hardware, and/or various combinations thereof. At a minimum, however, modules are not to be interpreted as software that is not implemented on hardware, firmware, or recorded on a non-transitory processor readable recordable storage medium (i.e., modules are not software per se). Indeed "module" is to be interpreted to always include at least some physical, non-transitory hardware such as a part of a processor or computer. Two different modules can share the same physical hardware (e.g., two different modules can use the same processor and network interface). The modules described herein can be combined, integrated, separated, and/or duplicated to support various applications. Also, a function described herein as being performed at a particular module can be performed at one or more other modules and/or by one or more other devices instead of or in addition to the function performed at the particular module. Further, the modules can be implemented across multiple devices and/or other components local or remote to one another. Additionally, the modules can be moved from one device and added to another device, and/or can be included in both devices.

The subject matter described herein can be implemented in a computing system that includes a back-end component (e.g., a data server), a middleware component (e.g., an application server), or a front-end component (e.g., a client computer having a graphical user interface or a web browser through which a user can interact with an implementation of the subject matter described herein), or any combination of such back-end, middleware, and front-end components. The components of the system can be interconnected by any form or medium of digital data communication, e.g., a communication network. Examples of communication networks include a local area network ("LAN") and a wide area network ("WAN"), e.g., the Internet.

Approximating language, as used herein throughout the specification and claims, can be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language can correspond to the precision of an instrument for measuring the value. Here and throughout the specification and claims, range limitations can be combined and/or interchanged, such ranges are identified and include all the sub-ranges contained therein unless context or language indicates otherwise.

One skilled in the art will appreciate further features and advantages of the invention based on the above-described embodiments. Accordingly, the present application is not to be limited by what has been particularly shown and described, except as indicated by the appended claims. All publications and references cited herein are expressly incorporated by reference in their entirety.

The invention claimed is:

1. A method comprising:
  receiving data characterizing an output of a linear variable differential transformer sensor coupled to an industrial equipment, the linear variable differential transformer sensor including
    a primary coil coupled to a voltage source,
    a first wire and a second wire coupled to the primary coil,
    a first secondary coil and a second secondary coil, the first secondary coil spaced apart from the primary coil and the second secondary coil spaced apart from the primary coil and the first secondary coil,
    a third wire connected to a first end of the first secondary coil, the third wire included in a first circuit,
    a fourth wire connected to a first end of the second secondary coil, the fourth wire included in a second circuit,
    a fifth wire connected to a second end of the first secondary coil and a second end of the second secondary coil, and
    a ferromagnetic core adjacent to the primary coil, the first secondary coil, and the second secondary coil,
  wherein the output includes a sum of a voltage of the first secondary coil and a voltage of the second secondary coil, the first secondary coil included in the first circuit and the second secondary coil included in the second circuit;
  determining, based on the received data, an integrity state of at least one circuit configured within the linear variable differential sensor, the integrity state identifying a state of the at least one circuit configured within the linear variable differential sensor; and
  providing the integrity state.

2. The method of claim 1, further comprising generating an alarm based on the integrity state.

3. The method of claim 2, further comprising displaying the alarm within a graphical user interface to an operator of the industrial equipment and/or causing a modification in operation of the industrial equipment.

4. The method of claim 1, wherein the received data includes analog data and/or digital data.

5. The method of claim 1, wherein the voltage source provides an alternating voltage to the primary coil, via the first wire and the second wire, causing the primary coil to generate an electromagnetic field inducing a voltage within the first secondary coil and a voltage within the second secondary coil.

6. The method of claim 1, wherein the determining includes
  determining that the sum of the voltage of the first secondary coil and the voltage of the second secondary coil is zero, and
  determining, based on the sum of the voltage of the first secondary coil and the voltage of the second secondary coil being zero, that the integrity state includes the open circuit state for a third circuit including the fifth wire connected to the second end of the first secondary coil and the second end of the second secondary coil.

7. The method of claim 1, wherein the determining includes
  determining a change in the sum of the voltage of the first secondary coil and the voltage of the second secondary coil compared to a fixed voltage value, and
  determining, based on the change in the sum of the voltage of the first secondary coil and the voltage of the second secondary coil compared to the fixed voltage value, that the integrity state includes the short circuit state for a fourth circuit including the primary coil, the first secondary coil, and the second secondary coil, the change in the sum of the voltage of the first secondary coil and the voltage of the second secondary coil resulting from a short in one or more turns of the primary coil, or the first secondary coil, or the second secondary coil.

8. The method of claim 1, wherein the determining includes determining a change in the sum of the voltage of the first secondary coil and the voltage of the second secondary coil compared to a fixed voltage value, and determining, based on the change in the sum of the voltage of the first secondary coil and the voltage of the second secondary coil compared to the fixed voltage value, that the integrity state incudes the short circuit state for a fifth circuit including the first wire and the second wire connected to the primary coil, and the third wire connected to a first end of the first secondary coil, and the fourth wire connected to the first end of the second secondary coil, the change in the sum of the voltage of the first secondary coil and the voltage of the second secondary coil resulting from a short at one or more locations of the fifth circuit.

9. The method of claim 1, wherein the industrial equipment includes one of a valve, and/or components of a valve, a turbine, and/or components of a turbine, a roller machine, and/or components of a roller machine, a compressor, and/or components of a compressor, a rudder in airplane and/or components of a rudder in an airplane, a rudder in a ship and/or components of a rudder in a ship, and/or components of artillery equipment, and/or components of artillery equipment.

10. A system comprising:
at least one data processor; and
memory storing instructions, which when executed by at the least one data processor causes the at least one data processor to perform operations comprising:
receiving data characterizing an output of a linear variable differential transformer sensor coupled to an industrial equipment, the linear variable differential transformer sensor including
a primary coil coupled to a voltage source,
a first wire and a second wire coupled to the primary coil,
a first secondary coil and a second secondary coil, the first secondary coil spaced apart from the primary coil and the second secondary coil spaced apart from the primary coil and the first secondary coil,
a third wire connected to a first end of the first secondary coil, the third wire included in a first circuit,
a fourth wire connected to a first end of the second secondary coil, the fourth wire included in a second circuit,
a fifth wire connected to a second end of the first secondary coil and a second end of the second secondary coil, and
a ferromagnetic core adjacent to the primary coil, the first secondary coil, and the second secondary coil,
wherein the output includes a sum of a voltage of the first secondary coil and a voltage of the second secondary coil, the first secondary coil included in the first circuit and the second secondary coil included in the second circuit;
determining, based on the received data, an integrity state of at least one circuit configured within the linear variable differential transformer sensor, the integrity state identifying a functional circuit state of the at least one circuit configured within the linear variable differential transformer sensor; and
providing the integrity state.

11. The system of claim 10, wherein the determining includes determining that the sum of the voltage of the first secondary coil and the voltage of the second secondary coil is zero, and
determining, based on the sum of the voltage of the first secondary coil and the voltage of the second secondary coil being zero, that the integrity state includes an open circuit state for a third circuit including the fifth wire connected to the second end of the first secondary coil and the second end of the second secondary coil.

12. The system of claim 10, wherein the determining includes
determining a change in the sum of the voltage of the first secondary coil and the voltage of the second secondary coil compared to a fixed voltage value, and
determining, based on the change in the sum of the voltage of the first secondary coil and the voltage of the second secondary coil compared to the fixed voltage value, that the integrity state includes the short circuit state for a fourth circuit including the primary coil, the first secondary coil, and the second secondary coil, the change in the sum of the voltage of the first secondary coil and the voltage of the second secondary coil resulting from a short in one or more turns of the primary coil, or the second coil, or the third coil.

13. The system of claim 10, wherein the determining includes
determining a change in the sum of the voltage of the first secondary coil and the voltage of the second secondary coil compared to a fixed voltage value, and
determining, based on the change in the sum of the voltage of the first secondary coil and the voltage of the second secondary coil compared to the fixed voltage value, that the integrity state incudes a short circuit state for a fifth circuit including the first wire and the second wire connected to the primary coil, the third wire connected to a first end of the second coil, and the fourth wire connected to the first end of the third coil, the change in the sum of the voltage of the first secondary coil and the voltage of the second secondary coil resulting from a short at one or more locations of the fifth circuit.

14. The system of claim 10, wherein the instructions further cause the processor to
determine that the integrity state of the primary coil is the open circuit state and/or the short circuit state based on the sum of the voltage of the first secondary coil and the voltage of the second secondary coil equaling zero;
determine that the integrity state of the first wire and/or the second wire connected to the primary coil is an open circuit state and/or a short circuit state based on the sum of the voltage of the first secondary coil and the voltage of the second secondary coil equaling zero;
determine that the integrity state of the second coil is the open circuit state and/or the short circuit state based on the sum of the voltage of the first secondary coil and the voltage of the second secondary coil equaling a voltage of the fourth wire connected to a first end of the third coil, the fourth wire included in the second circuit;
determine that the integrity state of the third coil of the sensor is the open circuit state and/or the short circuit state based on the sum of the voltage of the first secondary coil and the voltage of the second secondary coil equaling a voltage of the third wire connected to a first end of the second coil, the third wire included in the first circuit;

determine that the integrity state of the third wire connected to a first end of the second coil is the open circuit state and/or the short circuit state based on the sum of the voltage of the first secondary coil and the voltage of the second secondary coil equaling a voltage of the fourth wire connected to a first end of the third coil, the third wire included in the first circuit and the fourth wire included in the second circuit;

determine that the integrity state of the fourth wire connected to a first end of the third coil is the open circuit state and/or the short circuit state based on the sum of the voltage of the first secondary coil and the voltage of the second secondary coil equaling a voltage of the third wire connected to a first end of the second coil, the third wire included in the first circuit and the fourth wire included in the second circuit;

determine that the integrity state of the third wire connected to a first end of the second coil and the fourth wire connected to a first end of the third coil is the short circuit state based on the sum of the voltage of the first secondary coil and the voltage of the second secondary coil equaling zero, the third wire included in the first circuit, and the fourth wire included in the second circuit;

determine that the circuit integrity state of the fifth wire connected to the second end of the second coil and the second end of the third coil is the open circuit state based on the sum of the voltage of the first secondary coil and the voltage of the second secondary coil equaling zero;

determine that the integrity state of the primary coil, or the second coil, or the third coil is the short one or more turns state based on a change in the sum of the voltage of the first secondary coil and the voltage of the second secondary coil; and determine that the integrity state of the first wire and the second wire connected to the primary coil, and the third wire connected to the first end of the second coil, or the fourth wire connected to the first end of the third coil is the short circuit state based on a change in the sum of the voltage of the first secondary coil and the voltage of the second secondary coil.

15. A non-transitory computer readable medium storing instructions, which when executed by at least one data processor cause the at least one data processor to perform operations comprising:

receiving data characterizing an output of a linear variable differential transformer sensor coupled to an industrial equipment, the linear variable differential transformer sensor including,
  a primary coil coupled to a voltage source,
  a first wire and a second wire coupled to the primary coil,
  a first secondary coil and a second secondary coil, the first secondary coil spaced apart from the primary coil and the second secondary coil spaced apart from the primary coil and the first secondary coil,
  a third wire connected to a first end of the first secondary coil, the third wire included in a first circuit,
  a fourth wire connected to a first end of the second secondary coil, the fourth wire included in a second circuit,
  a fifth wire connected to a second end of the first secondary coil and a second end of the second secondary coil, and
  a ferromagnetic core adjacent to the primary coil, the first secondary coil, and the second secondary coil,
  wherein the output includes a sum of a voltage of the first secondary coil and a voltage of the second secondary coil, the first secondary coil included in the first circuit and the second secondary coil included in the second circuit;

determining, based on the received data, an integrity state of at least one circuit configured within the linear variable differential transformer sensor, the integrity state identifying a state of the at least one circuit configured within the linear variable differential transformer sensor; and providing the integrity state.

* * * * *